United States Patent
Ohara et al.

(10) Patent No.: US 7,498,904 B2
(45) Date of Patent: Mar. 3, 2009

(54) PIEZOELECTRIC THIN FILM RESONATOR AND DEVICES PROVIDED WITH THE SAME

(75) Inventors: Ryoichi Ohara, Kawasaki (JP); Naoko Yanase, Kawasaki (JP); Kenya Sano, Kawasaki (JP); Takaaki Yasumoto, Kawasaki (JP); Kazuhiko Itaya, Yokohama (JP); Takashi Kawakubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 11/447,999

(22) Filed: Jun. 7, 2006

(65) Prior Publication Data
US 2006/0279382 A1    Dec. 14, 2006

(30) Foreign Application Priority Data
Jun. 8, 2005    (JP) ............................ 2005-168251

(51) Int. Cl.
    *H03H 9/00*    (2006.01)
(52) U.S. Cl. ....................................... 333/189; 333/187
(58) Field of Classification Search ......... 333/187–189, 333/190–192
    See application file for complete search history.

(56) References Cited

U.S. PATENT DOCUMENTS

| | | | |
|---|---|---|---|
| 6,384,697 | B1 | 5/2002 | Ruby |
| 6,424,237 | B1 * | 7/2002 | Ruby et al. ................. 333/187 |
| 6,870,445 | B2 | 3/2005 | Kawakubo et al. |
| 7,221,242 | B2 * | 5/2007 | Asai et al. ................... 333/187 |
| 7,323,805 | B2 * | 1/2008 | Sano et al. ................... 310/358 |
| 2005/0184627 | A1 | 8/2005 | Sano et al. |

OTHER PUBLICATIONS

U.S. Appl. No. 10/581,030, filed May 30, 2006, Ohara et al.
U.S. Appl. No. 11/447,999, filed Jun. 7, 2006, Ohara et al.
U.S. Appl. No. 10/582,229, filed Jun. 9, 2006, Itaya et al.
U.S. Appl. No. 11/376,266, filed Mar. 16, 2006, Yanase et al.
Hiroaki Satoh, et al., "A 400MHz One-Chip Oscillator Using An Air-Gap Type Thin Film Resonator", IEEE 1987 SU Symp. Proceedings, 1987, 6 Pages.

* cited by examiner

*Primary Examiner*—James H Cho
(74) *Attorney, Agent, or Firm*—Oblon, Spivak, McClelland, Maier & Neustadt, P.C.

(57) ABSTRACT

A piezoelectric thin film resonator includes a substrate in which a cavity is formed, a first electrode having a first electrode edge and partly spanning the cavity on the substrate; a piezoelectric layer placed on the first electrode, a second electrode having a second electrode edge and placed on the piezoelectric layer, a resonator unit constituted by an overlapping part of the first electrode, the piezoelectric layer, the second electrode, and the cavity; and a second lead wiring which is integral with the second electrode, extends to the substrate where the cavity is not present, and has a width larger than a part of a peripheral length of the cavity to which the second electrode edge extends. In the piezoelectric thin film resonator, a first length defined by the periphery of the first electrode of the resonator unit is larger than a second length defined by the second electrode edge of the resonator unit.

20 Claims, 11 Drawing Sheets

RATE (%) OF FIRST PERIPHERAL LENGTH L1

PIEZOELECTRIC THIN FILM RESONATOR AND DEVICES PROVIDED WITH THE SAME

CROSS REFERENCE TO RELATED APPLICATIONS

This application is based upon and claims the benefit of priority from prior Japanese Patent Application No. 2005-168251 filed on Jun. 8, 2005, the entire contents of which are incorporated by reference herein.

BACKGROUND OF THE INVENTION

1. Field of the Invention

This invention relates to a piezoelectric thin film resonator and devices provided with the same, and more particularly relates to a piezoelectric thin film resonator which operates on longitudinal vibrations produced along a thickness of a piezoelectric thin film, and a high frequency filter and a voltage-controlled oscillator provided with such piezoelectric thin film resonators.

2. Description of the Related Art

In order to meet development and technological innovation of radio communications, communication devices compatible with a plurality of transmission-reception systems are in much demand. Sophisticated mobile radio terminals are required to be constituted by miniaturized components, modularized components or the like. Filters occupy a large part of passive components in a mobile radio terminal circuit. Therefore, the filters should be miniaturized or modularized in order to miniaturize the circuit and reduce the number of components therein.

Dielectric filters, surface acoustic wave (SAW) filters, LC filters or the like are very popular at present. Filters constituted by thin film bulk elastic wave resonators (piezoelectric thin film resonators) seem most promising in view of the miniaturization and modularization. Such filters operate on resonances of piezoelectric layers. Even when the filters are closely placed, they do not interfere with one another. Closely placed filters may interfere with one another when they operate on electromagnetic waves. Therefore, the filters constituted by piezoelectric thin film resonators can be easily miniaturized compared with dielectric filters or LC filters.

Since high frequency bands are used for the radio communications, SAW filters which operate on surface waves have to be micro-fabricated on a sub-micron level, and cannot be manufactured at a moderate price. On the contrary, filters constituted by piezoelectric thin film resonators operate on longitudinal vibrations produced along a thickness of a piezoelectric layer. An operation band of the filter can be easily raised by thinning the piezoelectric layer. Since a planar size of the filter is required to be approximately 1 μm at most, a fabricating cost of the filter will not be increased even when the operation frequency band is raised. Further, piezoelectric thin film resonators are not made of piezoelectric substrates which are in heavy usage for SAW filters, but are made of semiconductor substrates such as Si substrates or GaAs substrates. LSI chips and filters can be monolithic.

With the piezoelectric thin film resonator (called the "resonator"), energy of excited elastic vibrations should be trapped, so that a top and a bottom of the resonator face with a cavity. An acoustic impedance of a piezoelectric layer of the resonator and an acoustic impedance of an electrode applying a voltage to the piezoelectric layer differ from an acoustic impedance of the air by approximately several figures. Therefore, elastic vibrations are effectively reflected at a border between the electrode and air, which enables the energy of elastic waves to be trapped in the resonator. The top of the resonator is exposed to the air. It is technically important how to make a cavity at the lower part of the resonator.

Japanese Patent Laid-Open Publication No. 2000-069,594 (called the "Reference 1") discloses a method of manufacturing a piezoelectric thin film resonator. In the resonator, a sacrificial layer is embedded in a substrate surface, and a top electrode, a piezoelectric layer and a bottom electrode are formed on the substrate surface. The sacrificial layer is finally removed, thereby making a cavity. Further, Japanese Patent Laid-Open Publication No. 2001-185,985 (called the "Reference 2") discloses a method of manufacturing a piezoelectric thin film resonator, in which a resonator is formed on a substrate surface, and the substrate is etched away on a back side thereof in order to make a cavity. In the References 1 and 2, the resonators in which the bottom electrodes, piezoelectric layers and top electrodes are stacked are suspended in a space above the cavities, which makes the resonators mechanically weak.

Japanese Patent Laid-Open Publication No. 2002-140,075 (called the "Reference 3") describes a piezoelectric thin film resonator in which a bottom electrode spans a cavity, and remains flat on the cavity. However, lateral dimensions are increased, and parasitic capacitance is increased between the bottom and top electrodes, which reduces an effective electric-mechanical coupling factor of the resonator. Further, Japanese Patent Laid-Open Publication No. Hei 9-130,200 (called the "Reference 4") describes a piezoelectric thin film resonator in which a bottom electrode is processed in an area overlapping with a cavity by controlling residual stress of a thin film, so that no parasitic capacitance will be produced.

With the piezoelectric thin film resonator of the Reference 4, a lateral dimension of the lower electrode is smaller than that of the upper electrode, or both the bottom and top electrodes have the same size. The bottom and top electrodes are placed to face with each other, and a piezoelectric layer is inserted between the bottom and top electrodes, so that excited piezoelectric vibrations are propagated via the piezoelectric layer to a perimeter of the resonator. As a result, the Q performance will be worsened, or unnecessary spurious vibrations will be produced.

BRIEF SUMMARY OF THE INVENTION

The present has been contemplated in order to overcome problems of the related art, and is intended to provide a piezoelectric thin film resonator which can maintain high Q performance, prevent unnecessary spurious responses, and improve mechanical strength.

A further object of the invention is to provide a high frequency filter and a voltage-controlled oscillator which are provided with the foregoing piezoelectric thin film resonators.

According to a first aspect of the embodiment of the invention, there is provided a piezoelectric thin film resonator, which includes a substrate in which a cavity is formed, a first electrode having a first electrode edge and partly spanning the cavity on the substrate, a piezoelectric layer placed on the first electrode; a second electrode having a second electrode edge and placed on the piezoelectric layer, a resonator unit constituted by overlapping parts of the first electrode, the piezoelectric layer and the second electrode, and the cavity; and a second lead wiring which is integral with the second electrode, extends to the substrate where the cavity is not present, and has a width larger than a part of a peripheral length of the cavity to which the second electrode edge extends. In the piezoelectric thin film resonator, wherein a first length defined by the periphery of the first electrode of the resonator unit is larger than a second length defined by the edge of the second electrode of the resonator unit.

In accordance with a second aspect of the embodiment, there is provided a piezoelectric thin film resonator, which includes a substrate in which a cavity is formed; a first electrode having a first electrode edge and partly spanning the cavity on the substrate; a piezoelectric layer placed on the first electrode; a second electrode having a second electrode edge and placed on the piezoelectric layer; a resonator unit constituted by overlapping parts of the first electrode, the piezoelectric layer and the second electrode; and a second lead wiring which is integral with the second electrode, extends to the substrate where the cavity is not present, and has a width which is larger than 50% of a peripheral length of the cavity to which the second electrode edge extends. In the piezoelectric thin film resonator, a first length defined by the first electrode edge of the resonator unit is by 50% or more larger than an entire peripheral length of the resonator unit.

According to a third aspect of the embodiment, there are provided a high frequency filter and voltage-controlled oscillator which are constituted by the foregoing piezoelectric thin film resonators.

BRIEF DESCRIPTION OF THE DRAWINGS

The same reference numerals refer to the same parts throughout various Figures.

DETAILED DESCRIPTION OF THE INVENTION

Figure 1:
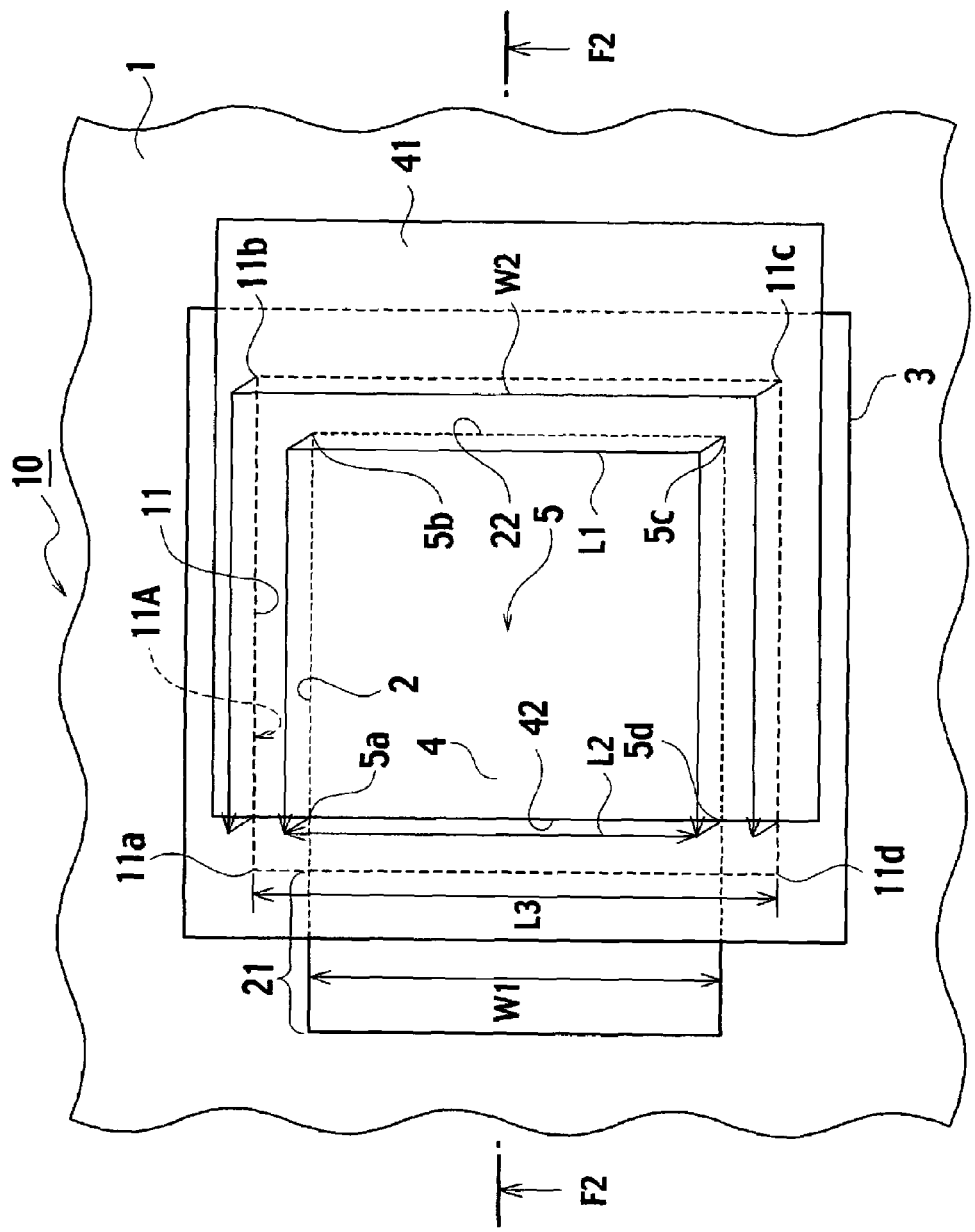
FIG. 1 is a top view of a piezoelectric thin film resonator according to one example of the invention.

The invention will be described hereinafter with reference to an example shown in the drawings.

[Structure of Piezoelectric Thin Film Resonator]

Figure 2:
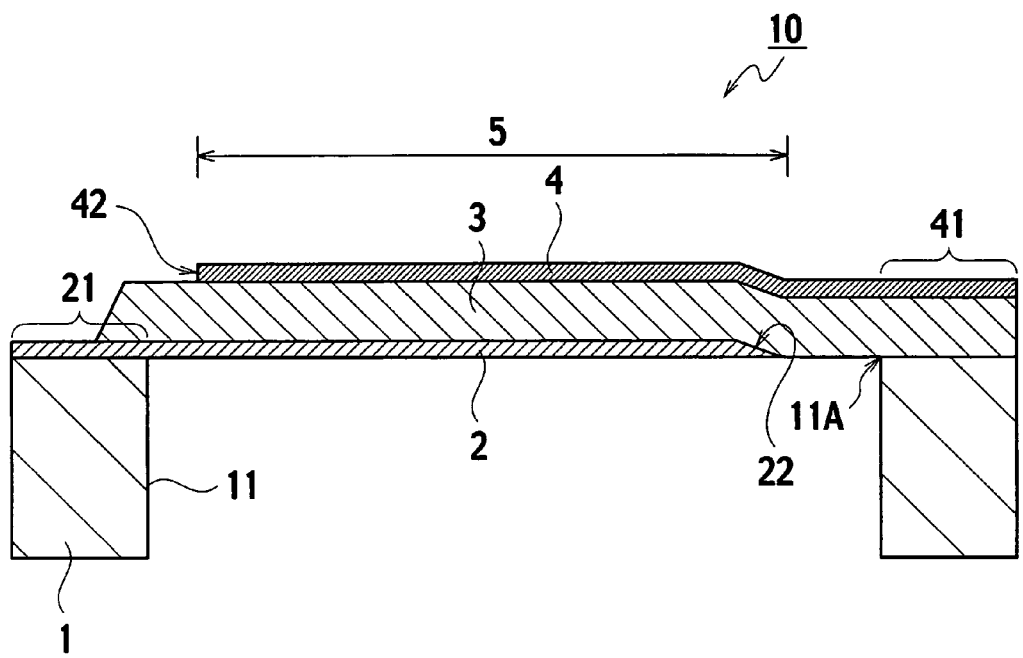
FIG. 2 is a sectional view of the piezoelectric thin film resonator, taken along line F2-F2 in FIG. 1.

Referring to FIG. 1 and FIG. 2, a piezoelectric thin film resonator 10 (called the "resonator 10") is basically composed of a substrate 1 having a cavity 11 on its center; a first electrode 2 (serving as a bottom electrode) partly spanning the cavity 11; a piezoelectric layer 3 placed on the first electrode 2; a second electrode 4 (serving as a top electrode) placed on the piezoelectric layer 3; and a resonator unit 5 placed at a position where the first electrode 2 and the second electrode 4 overlap. The resonator 10 further includes a second lead wiring 41, which is pulled out to an area outside the cavity 11. The second lead wiring 41 has a width W2 along a periphery 11A (extending between corners 11a-11b-11c-11d) of the cavity 11. The width W2 is larger than a peripheral length L3 of an edge (a second electrode edge) 42 of the second electrode 4. A first peripheral length L1 defined by an edge (a first electrode edge) 22 of the first electrode 2 of the resonator unit 5 is longer than a second peripheral length L2 defined by the edge 42. The first peripheral length L1 is designed to be 50% or more of the overall peripheral dimension (L1+L2) of the resonator unit 5, i.e., the edge 22 occupies more than half of the overall peripheral dimension. Further, the width W2 is designed to be 50% or more of the overall peripheral dimension of the periphery 11A of the cavity 11.

A first lead wiring 21 is placed on the substrate 1 and is electrically connected to the first electrode 2 as an integral part. The first lead wiring 21 is outside the cavity 11. A width W1 of the first lead wiring 21 along the periphery 11A (between the corners 11a and 11b) of the cavity 11 is shorter than the length L1 defined by the edge 22 of the resonator unit 5.

The term "cavity" represents a through-hole or a hollow in the shape of a prism. Therefore, the periphery 11A of the cavity 11 is rectangular. The first electrode 2 effectively functions within an area where it overlaps on the cavity 11. Further, the second electrode 4 effectively functions within an area where it overlaps on the cavity 11. The first and second lead wirings 21 and 41 are placed on areas outside the cavity 11. The resonating unit 5 is constituted by the electrode 2, piezoelectric layer 3, second electrode 4 and, cavity 11 (strictly speaking, the space over the second electrode 4). In short, the first electrode 2, piezoelectric layer 3 and second electrode 4 are stacked one over after another, and overlap on the cavity 11.

In this example, the first electrode 2 and the first lead wiring 21 are flush with each other, and are made of the same material. However, they are separated at the periphery 11A of the cavity 11. The first electrode 2 partly spans the cavity 11, and the first lead wiring 21 is pulled out outside the cavity 11. The second electrode 4 and the second lead wiring 41 are flush with each other, and are made of the same material. They are separated at the open area 11A of the cavity 11. The second electrode 4 partly spans the cavity 11, and the second lead wiring 41 is pulled out outside the cavity 11.

The resonator unit 5 has a contour defined by the edge 22 of the first electrode 2, and the edge 42 of the second electrode 4. The first electrode 2 terminates at the edge 22 which is apart from the open area 11A of the cavity 11 by an alignment allowance. The second electrode 4 terminates at the edge 42 which is apart from the open area 11A of the cavity 11 by another alignment allowance.

Referring to FIG. 2, the piezoelectric layer 3 is formed on the first electrode 2, and has a step at the edge 22 of the first electrode 2. On the contrary, the second electrode 4 is formed on the piezoelectric layer 3, and there is no step at the edge 42 of the second electrode 4. The first electrode 2 should be electrically connected to the first lead wiring 21 via a part of the edge 22. Further, the second electrode 4 should be electrically connected to the second lead wiring 41 via a part of the edge 42. Therefore, the entire perimeter of the first electrode 2 cannot serve as the first edge 22. Further, the entire perimeter of the second electrode 4 cannot serve as the second peripheral edge 42.

Figure 3:
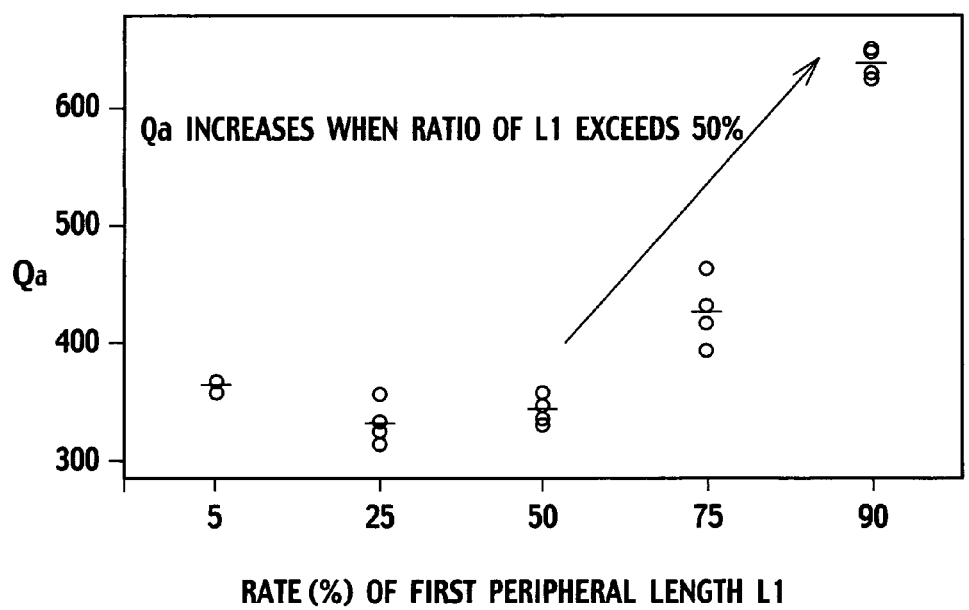
FIG. 3 is a graph showing the relationship between a peripheral length of a resonator unit of the piezoelectric thin film resonator and the Q performance.

FIG. 3 shows how the Q performance depends upon a ratio of the first peripheral length L1 to the second peripheral length L2 of the resonator unit 5. In FIG. 3, the abscissa denotes the proportion of the peripheral length L1 to the peripheral length L2, and the ordinate denotes the Q performance. When the proportion of L1 exceeds 50%, the Qa performance of an anti-resonance value tends to increase. Further, when the proportion of L1 exceeds 70%, the Qa performance of the anti-resonance value will be increased by 1.5 times at maximum.

The inventors consider that the Q performance is increased for the following reasons when vibrations are propagated from the resonator unit 5 toward its perimeter: a part of the vibrations is reflected by the step at the edge 22 of the first electrode 2 on the piezoelectric layer 3. There is no step on the second peripheral edge 42. The Qa performance depends upon resistances of the first and second electrodes 2 and 4, and surface roughness of the piezoelectric layer 3. However, when the first and second electrodes 2 and 4 are small, there is not negligible worsening of the Q performance due to vibrations reflected by the periphery of the resonator unit 5. The resonator 10 of this application has the high Q performance. Therefore, filter characteristics with small insertion losses within a pass-band can be realized when the resonator 10 is assembled in a filter having the ladder topology. Further, filter characteristics with precipitous performance at an edge of the pass band cab be accomplished.

In this example, the piezoelectric layer 3 has a high frequency band blocking and dispersing function. The term "dispersion" denotes the relationship between a wavelength and a frequency of lateral vibrations. The term "high frequency band blocking" denotes that no vibrations are dispersed (i.e., the vibrations are blocked) above the resonance point. The resonator unit 5 is constituted by the piezoelectric layer 3 having the foregoing characteristics, and laterally disperses Lamb waves in frequencies between resonance and anti-resonance points. This is effective in improving the Q performance. The piezoelectric layer 3 is preferably made of aluminum nitride (AlN), titanium oxide ($PbTiO_3$), or titanium-barium oxide ($BaTiO_3$). Especially, AlN contains Al, is widely employed as a piezoelectric material for wirings of semiconductor devices such as IC and LSI, is easily adaptable to semiconductor device fabricating processes, and is very suitable for practical use. Alternatively, piezoelectric materials with a low frequency band blocking function and containing ZnO and so on have modes in which vibrations are naturally trapped within the resonator unit, so that they can improve the Q performance without using the process of the present invention.

Referring to FIG. 2, the edge 22 of the first electrode 2 which defines the perimeter of the resonator unit 5 is tapered to have an acute angle, e.g., 60 degrees or less, and most preferably 30 degrees or less, with respect to the bottom and side of the first electrode 2. This is effective in protecting the piezoelectric layer 3 against cracks or voids, and making the resonator unit 5 mechanically strong. The more gently the first edge 22 is tapered, the less probable the cracks or voids will be caused. However, since the reflection efficiency of vibrations at the step on the edge 22 is lowered, it is not possible to improve the Q performance. Therefore, the edge 22 should be tapered to have an angle of 5 degrees or more with respect to the bottom and side of the first electrode 2.

As shown in FIG. 1 and FIG. 2, the second lead wiring 41 is integral with the second electrode 4, and has the width W2 which is larger than the peripheral length L3 of the edge 42. The second lead wiring 41 can widely support the second electrode 4, which is effective in further improving the mechanical strength of the resonator unit 5. The resonator 10 of this embodiment has a thickness of 2 μm and a peripheral length of 600 μm to 800 μm (each side of the periphery being 150 μm to 200 μm long), for instance. The resonator unit 5 is very thin, and looks suspended in air on the cavity 11. In order to protect the resonator unit 5 against mechanical breakage, layers constituting the resonator unit 5 should be controlled to undergo small stresses as possible, or the overall stresses on the resonator unit 5 should be controlled to be few as possible. With the first electrode 2, the first peripheral length L1 defined by the edge 22 of the resonator unit 5 is designed to be positively increased, thereby improving the Q performance. This is effective in mechanically strengthening the area where the second electrode 4 and the second lead wiring 41 which span the cavity 11. If a total of stresses applied to the first electrode 2, piezoelectric layer 3 and second electrode 4 is zero, the stress applied to an area over the cavity 11 where the second electrode 4 is not present will be unbalanced. As a result, stress concentration may occur on the corners of the cavity 11, or on the areas where the first electrode 2 is connected to the first lead wiring 21, and will cause cracks on the foregoing area. In order to overcome this problem, most of the perimeter of the second electrode 4 is made integral with the second lead wiring 41 (i.e., is made to extend onto the substrate 1), which is effective in remarkably preventing the stress concentration.

The resonator unit 5 may have any lateral dimension with respect to a lateral dimension of the cavity 11. The larger the cavity 11, the more frequently the stress concentration will occur at the corners of the cavity 11, or the connected area of the first electrode 2 and the first lead wiring 21, and will crack the connected area. Therefore, it is preferable that the lateral dimension of the resonator unit 5 is 60% or more of the lateral dimension of the cavity 11.

[Structure of Comparison Examples]

Figure 4:
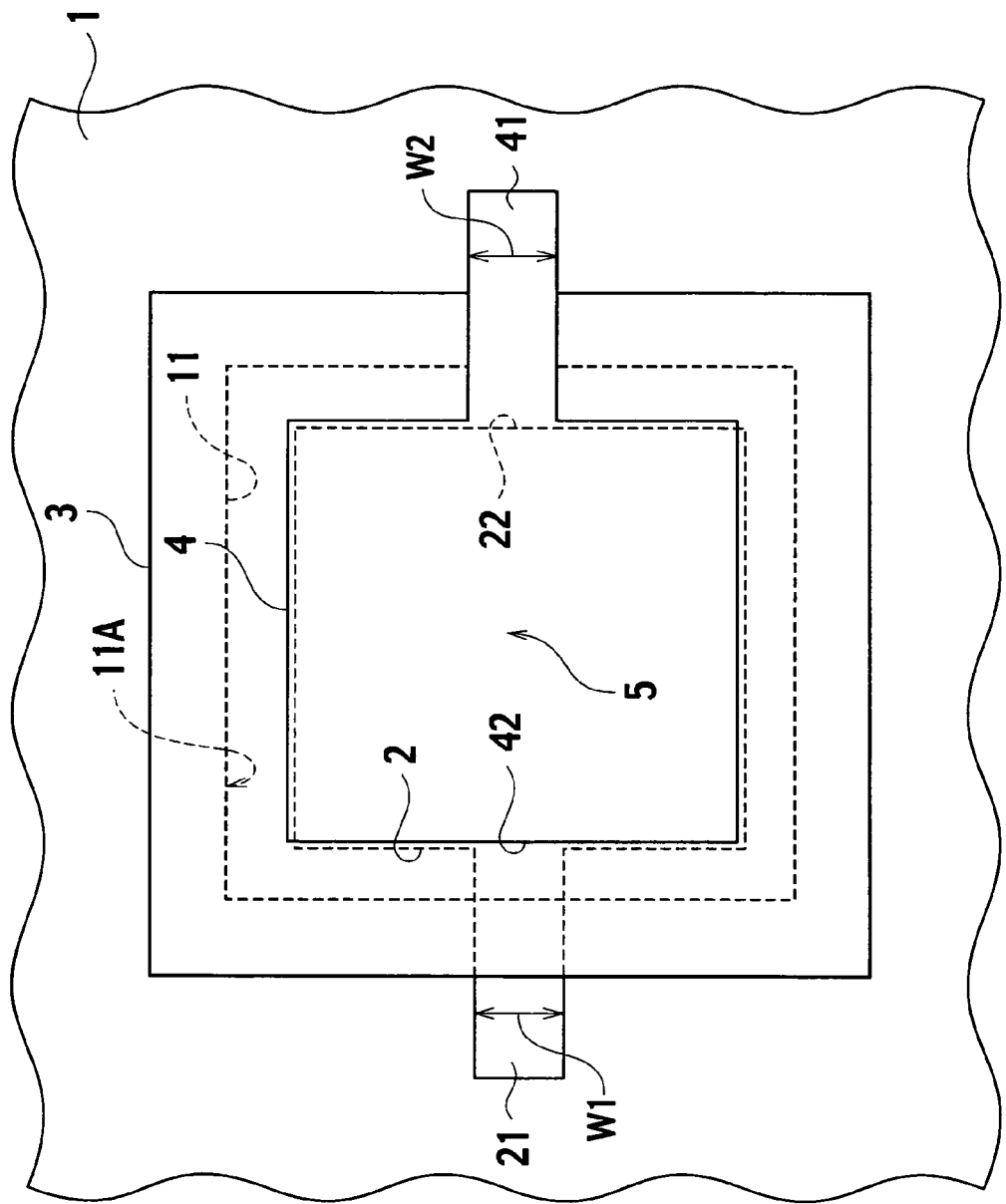
FIG. 4 is a top view of a first comparative example of a piezoelectric thin film resonator of the related art.

Referring to FIG. 4, a first comparison example resonator 10 includes a resonator unit 5 constituted by a first electrode 2 and a second electrode 4, both of which have the same lateral shape and dimension. A width W2 of a second lead wiring 41 is smaller than a length of one side of the perimeter of a resonator unit 5. This will lead to an increase of a series resistance for connecting the second electrode 4 and the second lead wiring 41, a decrease of a mechanical strength of the resonator unit 5, and production of unnecessary spurious resonances caused by small misalignment between the first electrode 2 and the second electrode 4.

Figure 5:
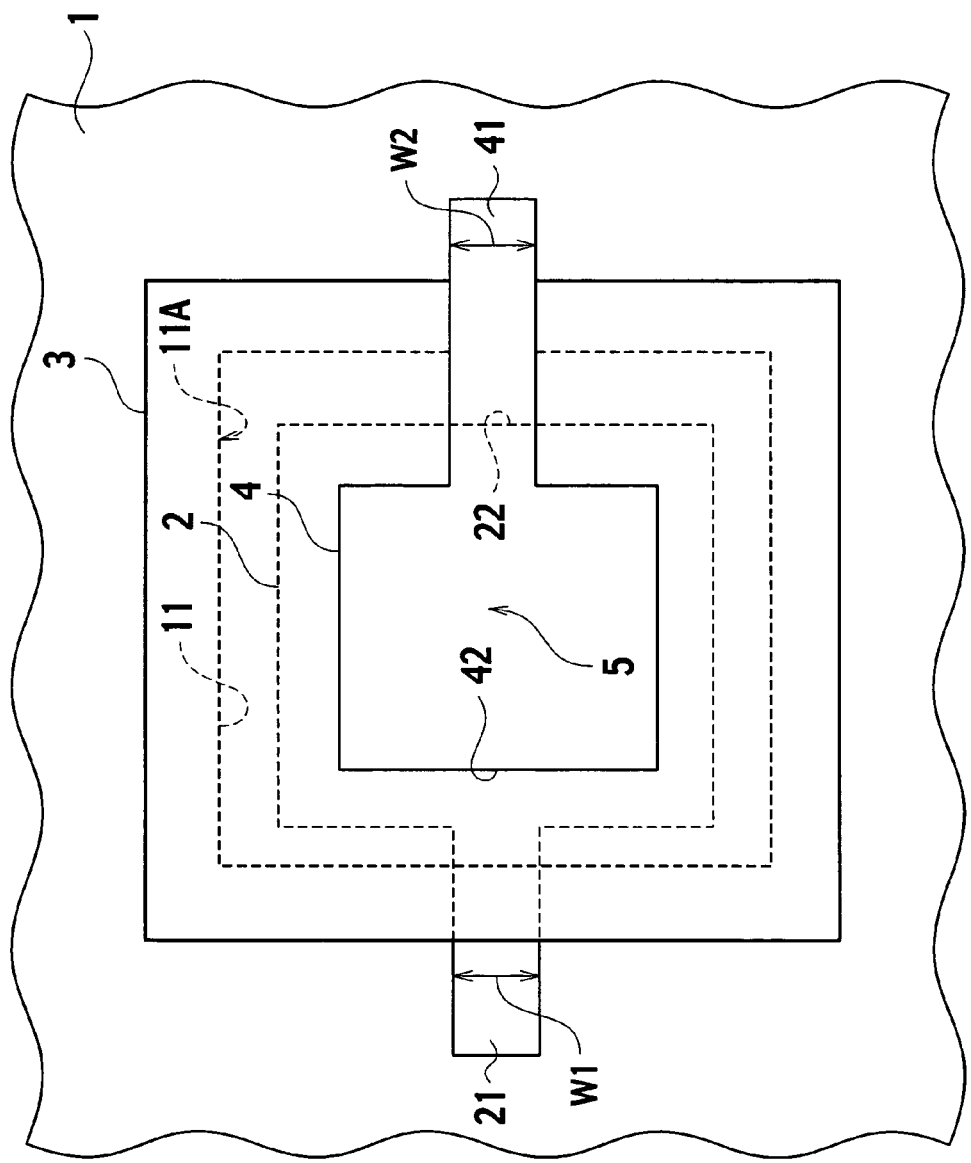
FIG. 5 is a top view of a second comparative example of a piezoelectric thin film resonator of the related art.

In a second comparison example resonator 10 shown in FIG. 5, a resonator unit 5 includes first and second electrodes 2 and 4. They are similar in their contours but have different sizes, i.e., the second electrode 4 is smaller than the first electrode 2. Further, a width W2 of a second lead wiring 41 is smaller than a length of one side of a perimeter of the resonator unit 5. This will lead to a decrease of mechanical strength of the resonator unit 5, placement of the resonator unit 5 at the center of the first electrode 2, insufficient blocking of vibrations due to a step on a piezoelectric layer 3, and production of unnecessary spurious resonances.

[Method of Fabricating Resonator]

Figure 6:
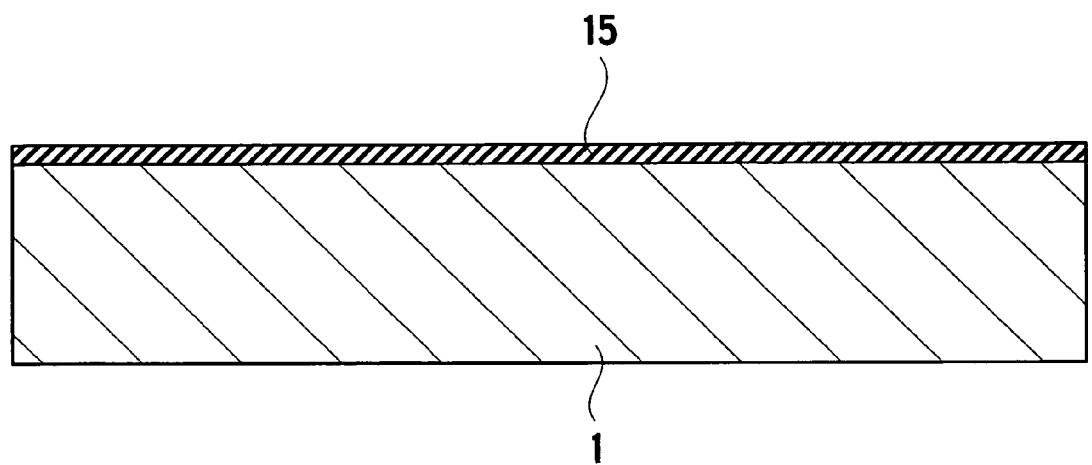
FIG. 6 is a side sectional view of a first step of forming the piezoelectric thin film resonator.

The resonator 10 is fabricated as described hereinafter. First of all, the substrate 1 is prepared. As shown in FIG. 6, an insulating film 15 is deposited on the substrate 1. For instance, the substrate 1 is made of silicon (Si), and the insulating film 15 is a thermo oxide silicon film which is 100 nm thick.

Figure 7:
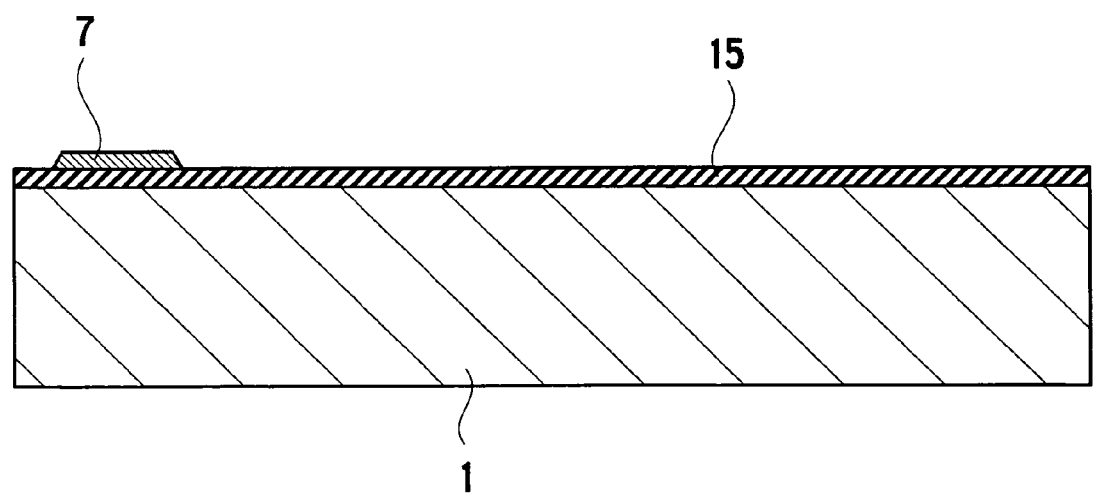
FIG. 7 is a side sectional view of a second step of forming the piezoelectric thin film resonator.
Figure 14:
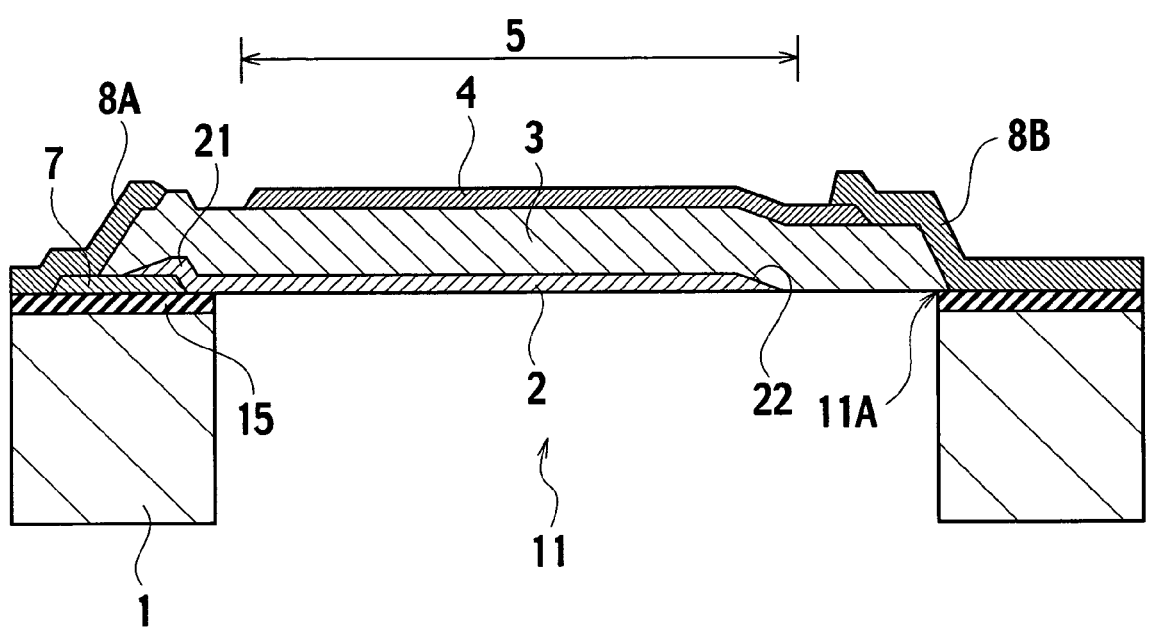
FIG. 14 is a side sectional view of a ninth step of forming the piezoelectric thin film resonator.

Referring to FIG. 7, a connecting wire 7 is formed on the insulating film 15 at an area where the first lead wiring 41 and a first wiring 8A (shown in FIG. 14) are connected. The connecting wire 7 is preferably made of molybdenum (Mo) which is not only conductive but also assures a sufficient etching ratio with the piezoelectric layer 3, and does not cause any breakage in the first lead wiring 41 when patterning the piezoelectric layer 3. For instance, molybdenum (Mo) is subject to the RF magnetron sputtering process, thereby making the connecting wire 7 400 nm thick. Specifically, the connecting wire 7 is made by forming an Mo film on the insulating film 15, and is etched and is patterned using a photolithographic mask. The connecting wire 7 has its peripheral edges tapered in order to enable the first lead wiring 21 to smoothly get over the sloped edge.

Figure 8:
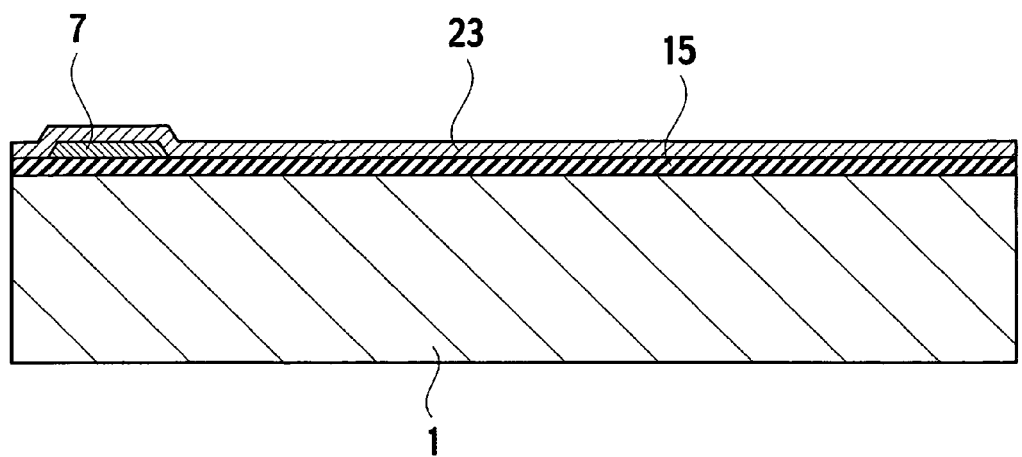
FIG. 8 is a side sectional view of a third step of forming the piezoelectric thin film resonator.

As shown in FIG. 8, a first electrode forming layer 23 is deposited on the substrate 1 and the junction wiring 7, and includes a 20 nm-thick amorphous film ($Al_{0.4}Ta_{0.6}$), a 300 nm-thick aluminum film (Al) and a 50 nm-thick AlN film. All of these films are formed by the RF magnetron sputtering process. The uppermost AlN film serves to improve crystalline characteristics of the piezoelectric layer 3. Further, the first electrode forming layer 23 is made by sequentially depositing the foregoing films one after another, so that the substrate 1 is not exposed to the air.

Figure 9:
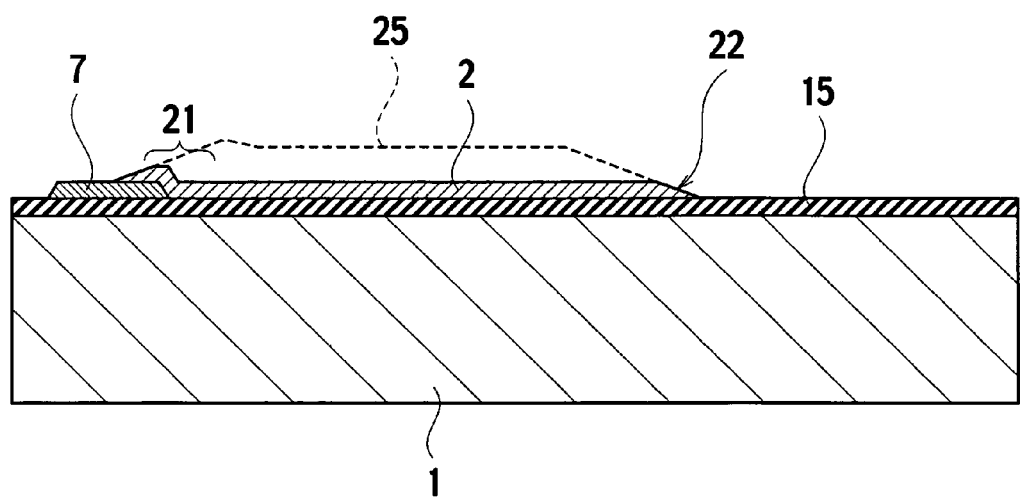
FIG. 9 is a side sectional view of a fourth step of forming the piezoelectric thin film resonator.

The first electrode forming layer 23 is etched and patterned using a photolithographic mask 25 (shown by a dashed line in FIG. 9), thereby making the first electrode 2 and the first lead wiring 21. The reactive ion etching (RIE) process using chloride gas is utilized for this purpose. The films constituting the first electrode forming layer 23 are collectively patterned. The edge 22 of the first electrode 2 is subject to the anisotropic etching process, and is tapered in accordance with the shape of a sloped edge of the mask.

Figure 10:
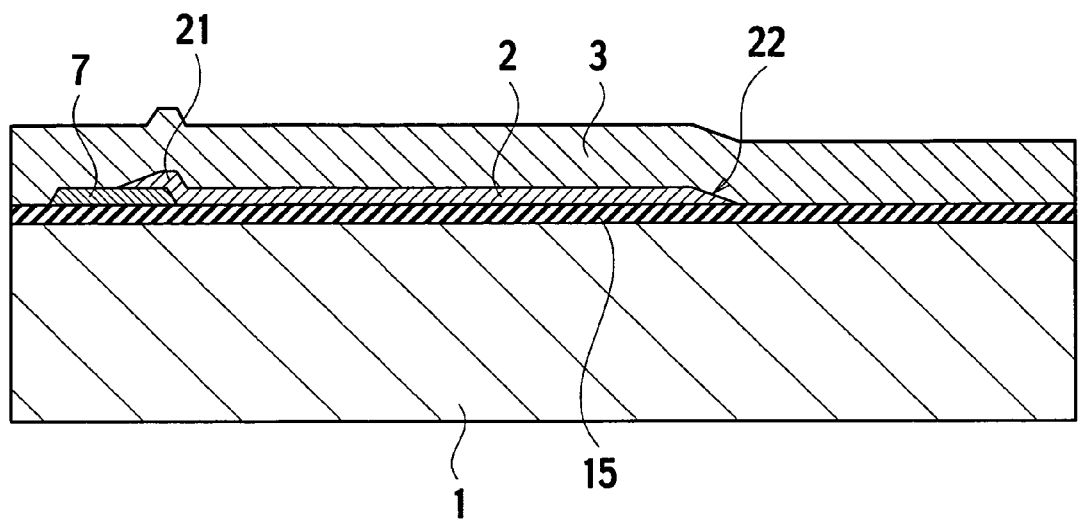
FIG. 10 is a side sectional view of a fifth step of forming the piezoelectric thin film resonator.

Referring to FIG. 10, the piezoelectric layer 3 is formed on the substrate 1, first electrode 2 and first lead wiring 21 by the RF magnetron sputtering process. The piezoelectric layer 3 is made of AlN, and is 2250 nm thick. Further, the patterned first electrode 2 and first lead wiring 21 may be preferably cleaned by the reverse sputtering process prior to forming the piezoelectric layer 3, thereby improving the crystalline characteristics of the piezoelectric layer 3.

Figure 11:
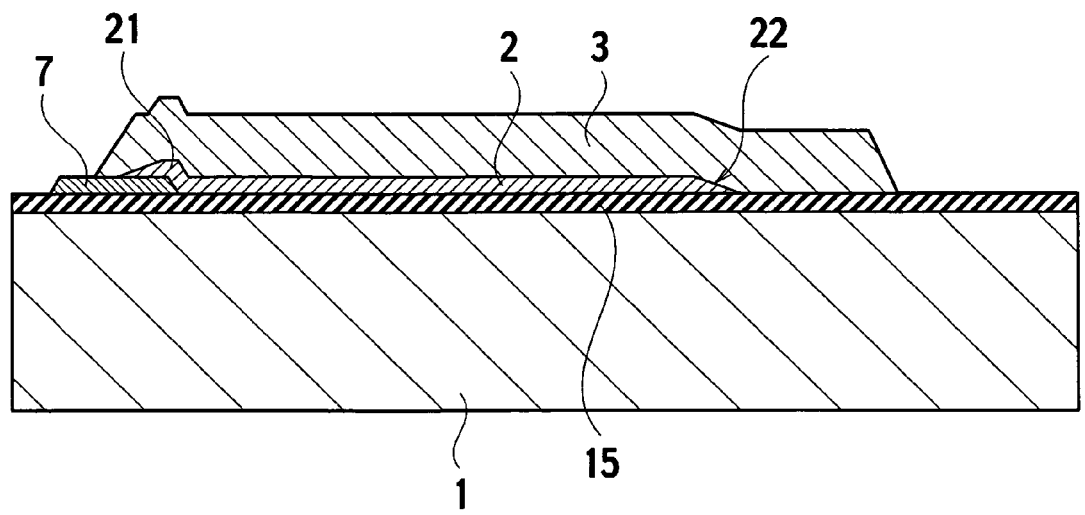
FIG. 11 is a side sectional view of a sixth step of forming the piezoelectric thin film resonator.

As shown in FIG. 11, the piezoelectric layer 3 is reactively ion-etched using chloride gas, and is patterned using a photolithographic mask. In this state, part of the piezoelectric layer 3 is patterned on the connecting wire 7. Since a sufficient etching ratio can be assured between the piezoelectric layer 3 and the connecting wire 7, the connecting wire 7 is not broken due to the patterning of the piezoelectric layer 3.

Figure 12:
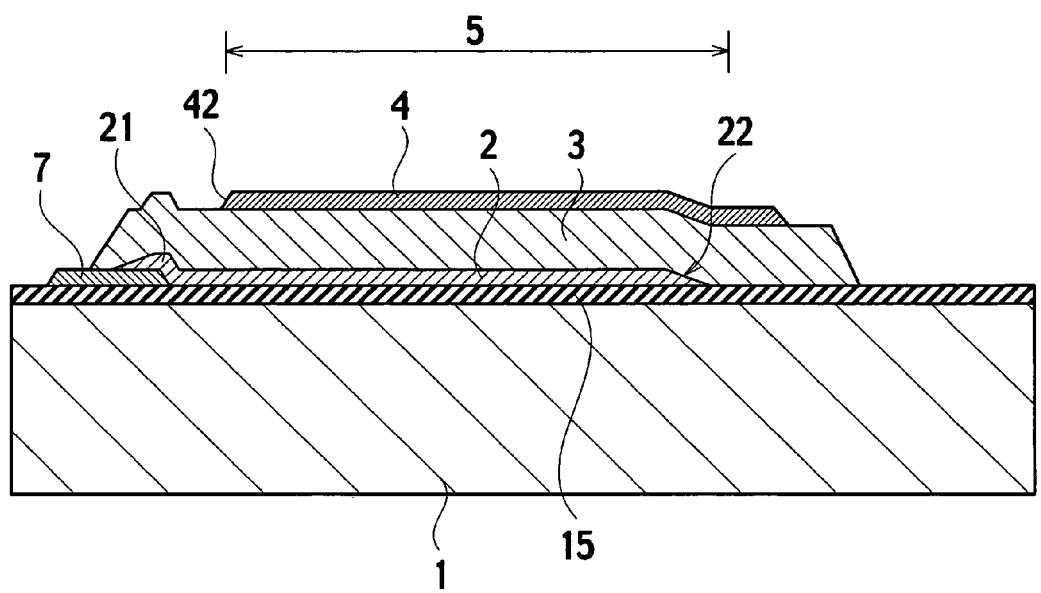
FIG. 12 is a side sectional view of a seventh step of forming the piezoelectric thin film resonator.

A second electrode forming layer (shown in FIG. 12) is deposited on the substrate 1 and the piezoelectric layer 3 by the RF magnetron sputtering process. The second electrode forming layer is made of Al, and is 300 nm thick. Thereafter, the second electrode forming layer is reactively ion-etched using chloride gas, and is patterned to make the second electrode 4 and the second lead wiring 41 (refer to FIG. 1 and FIG. 2).

Figure 13:
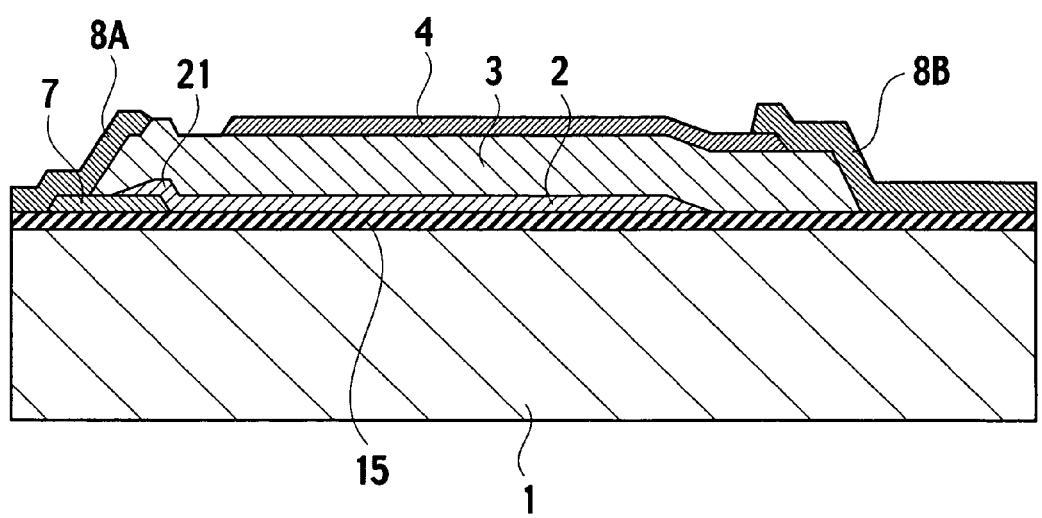
FIG. 13 is a side sectional view of an eighth step of forming the piezoelectric thin film resonator.

A mask is formed on the piezoelectric layer 3 and on a part of the substrate 1 where no wiring is present. The lift-off process is used for the mask making. Using the RF magnetron sputtering process, a wiring layer is formed on the mask as well as on the substrate 1. The wiring layer is made of Al, and is 1 µm thick. Thereafter, the mask is selectively removed in order to remove the wiring layer from the mask. As shown in FIG. 13, a first wiring 8A and a second wiring 8B are formed on the piezoelectric layer 3 except for the remaining mask. The first wiring 8A is electrically connected to the connecting wire 7 while the second wiring 8B is electrically connected to the lead wiring 41. Further, the first wiring 8A is electrically connected to the first lead wiring 21 via the connecting wire 7.

The substrate 1 is totally covered by a resin or resist protection film, and is then polished to have a thickness of 200 µm or less. The chemical and mechanical polishing process (CMP) is employed for this purpose. A mask is formed on the rear surface of the substrate 1 by the photolithographic process. The substrate 1 is etched on the back surface thereof using the BOSCH process, and by alternately supplying $SF_6$ and $C_4F_8$, so that the cavity 11 is made and has a vertical side wall. Only the substrate 1 is selectively etched in the BOSCH process. When the cavity 11 is completed in the substrate 1, the insulating film 15 is exposed, and functions to stop the etching process. Further, the lowermost amorphous metals of the insulating film 15 and the first electrode 2 are removed via the cavity 11 by the reactive ion etching (RIE) process using fluoride gas. The inner surface of the cavity 11 is vertically etched, so that the cavity 11 is in the shape of a quadratic prism in accordance with the periphery 11A. The resonator unit 5 is suspended in a space above the cavity 11.

The resonator 10 of the embodiment is completed after the foregoing procedures.

[Characteristics Assessment of Resonators]

Resonance characteristics of the resonator 10 have been assessed using a vector network analyzer (HP8510C). The resonator 10 is judged to have excellent resonance characteristics, i.e., a resonance frequency of approximately 1.9 GHz, an electric-mechanical junction constant of 6.7%, the Q performance of a resonance is 750, and the Qa performance of an anti-resonance is 700.

With the resonator 10 shown in FIG. 1, the three sides (5a-5b, 5b-5c and 5c-5d) of the resonator unit 5 are defined by the edge 22 of the first electrode 2, and the remaining side (5d-5a) is defined by the edge 42 of the second electrode 4. The first length L1 (between 5b-5c) of the resonator unit 5 is 75% of the entire peripheral length of the resonator unit 5. Vibrations caused by the step on the piezoelectric layer 3 along the edge 22 of the first electrode 2 can be efficiently reflected. This raises the Q performance.

[Characteristics Assessment of Comparison Examples]

Figure 15:
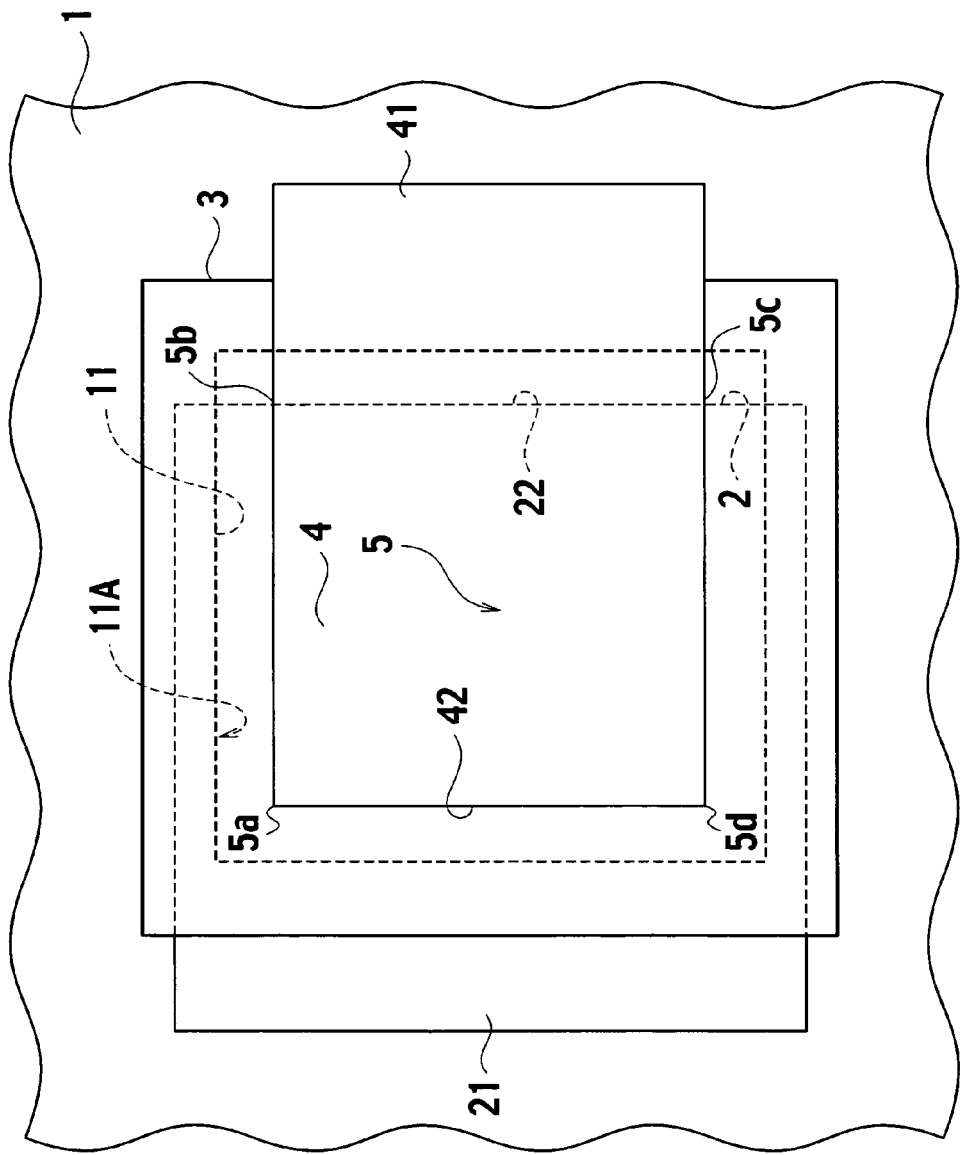
FIG. 15 is a top view of a third comparative example of a piezoelectric thin film resonator of the related art.

FIG. 15 shows a third example of a resonator (called the "third comparison resonator") which has been compared with the resonator 10 of the present invention. The third comparison resonator is fabricated under the same procedures as those of the resonator 10. The first length L1 and second length L2 defining the third comparison resonator are reversed. A side (5b-5c) of a resonator unit 5 of the comparison resonator is defined by an edge 22 of a first electrode 2, and the three remaining sides (5a-5b, 5c-5d and 5d-5a) are defined by an edge 42 of a second electrode 4. The first length L1 is 25% of the entire peripheral length of the resonator unit 5.

Resonance characteristics of the third comparison resonator have been also assessed using the vector network analyzer (HP8510C). A resonance frequency is approximately 1.9 GHz, an electric-mechanical junction constant is 6.7%, the Q performance of a resonance is 750, and the Q performance of an anti-resonance is 550. The Qa performance of anti-resonance is worse than that of the resonator 10 of the present invention.

[Application Examples of Resonator]

Figure 16:
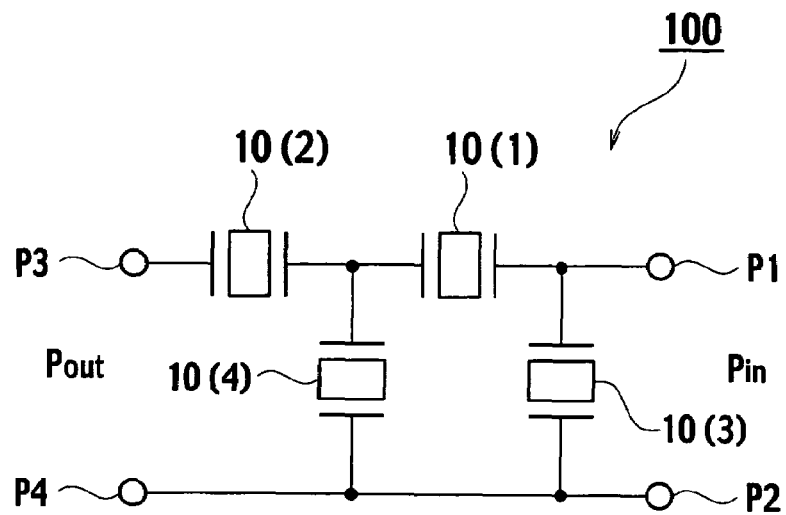
FIG. 16 shows a circuit of a high frequency filter provided with the piezoelectric thin film resonator of FIG. 1.
Figure 17:
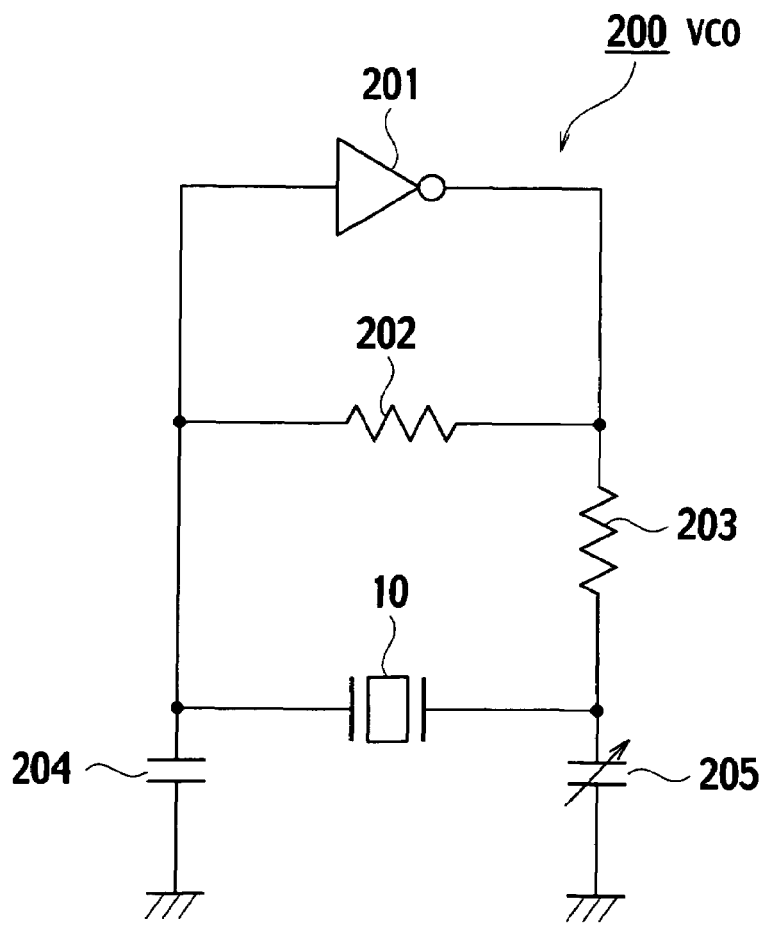
FIG. 17 shows a circuit of a high frequency oscillator provided with the piezoelectric thin film resonator of FIG. 1.

The foregoing resonator 10 may be applicable to a high frequency filter 100 (shown in FIG. 16), and a voltage-controlled oscillator 200 (shown in FIG. 17). Referring to FIG. 16, the high frequency filter 100 includes input terminals P1 and P2, output terminals P3 and P4, resonators 10(1) and 10(2) inserted in series, and resonators 10(3) and 10(4) inserted in parallel.

The voltage-controlled oscillator 200 includes a resonator 10, an inverter 201, resistance elements 202 and 203, and variable capacity elements 204 and 205. Refer to FIG. 17.

Both of the high frequency filter 100 and the voltage-controlled oscillator 200 includes the resonators 10, which improves the resonance characteristics, and promotes downsizing.

The resonator 10 of the foregoing example of the present invention can improve the Q performance, prevent unnecessary spurious resonances, and promote the mechanical strength of the resonator unit 5.

The invention being thus described, it will be obvious that the same may be varied in many ways. Such variations are not to be regarded as a departure from the spirit and scope of the invention. For instance, the cavity 11 may be bottomed, and acoustic reflecting layers may be placed in the cavity 11.

Further, the cavity 11 may have any contour as well as the rectangular contour, e.g., the cavity 11 may be triangular, pentagonal, polygonal, oval, or circular. Still further, the contours of the first and second electrodes 2 and 4 are not always required to be similar to that of the cavity 11, but may be different.

What is claimed is:

1. A piezoelectric thin film resonator comprising:
   a substrate in which a cavity is formed;
   a first electrode having a first electrode edge and partly spanning the cavity in the substrate;
   a piezoelectric layer placed on the first electrode;
   a second electrode having a second electrode edge and placed on the piezoelectric layer;
   a resonator unit constituted by overlapping the first electrode, the piezoelectric layer, the second electrode, and the cavity;
   a second lead wiring which is integral with the second electrode, extends to the substrate where the cavity is not present, and has a width larger than a part of a peripheral length of the cavity to which the second electrode edge extends; and
   wherein a first length defined by the periphery of the first electrode edge of the resonator unit is larger than a second length defined by the second electrode edge of the resonator unit.

2. The piezoelectric thin film resonator of claim 1 further comprising a first lead wiring which is integral with the first electrode and extends to an area where the cavity is absent on the substrate, the first lead wiring having a width of a wiring extending along the periphery of the cavity, and the width being smaller than a length of the first electrode edge.

3. The piezoelectric thin film resonator of claim 2, wherein the first length defined by the periphery of the first electrode edge is larger than 50% of the whole peripheral length of the resonator unit.

4. The piezoelectric thin film resonator of claim 2, wherein the first length defined by the periphery of the first electrode edge is larger than 70% of the whole peripheral length of the resonator unit.

5. The piezoelectric thin film resonator of claim 1, wherein the first length defined by the periphery of the first electrode edge is larger than 50% of the whole peripheral length of the resonator unit.

6. The piezoelectric thin film resonator of claim 1, wherein the first length defined by the periphery of the first electrode edge is larger than 70% of the whole peripheral length of the resonator unit.

7. The piezoelectric thin film resonator of claim 1, wherein the piezoelectric layer has a high frequency band blocking and dispersing function.

8. The piezoelectric thin film resonator of claim 7, wherein the piezoelectric layer is made of AlN, $PbTiO_3$, or $BaTiO_3$.

9. The piezoelectric thin film resonator of claim 1, wherein the piezoelectric layer is mainly made of nitride aluminum.

10. The piezoelectric thin film resonator of claim 9, wherein the piezoelectric layer is made of AlN.

11. The piezoelectric thin film resonator of claim 1, wherein the first electrode edge is tapered to have an angle of 60 degrees or smaller with respect to a bottom and side thereof.

12. The piezoelectric thin film resonator of claim 11, wherein the first electrode edge is tapered to have an angle of 30 degrees or smaller with respect to a bottom and side thereof.

13. The piezoelectric thin film resonator of claim 12, wherein the first electrode edge is tapered to have an angle of 5 degrees or smaller with respect to a bottom and side thereof.

14. The piezoelectric thin film resonator of claim 11, wherein the first electrode edge is tapered to have an angle of 5 degrees or smaller with respect to a bottom and side thereof.

15. The piezoelectric thin film resonator of claim 1, wherein the piezoelectric layer is made of AlTa, Al, or AlN.

16. The piezoelectric thin film resonator of claim 1, wherein a size of the resonator is 60% or more of a size of the upper part of the cavity.

17. A high frequency filter comprising the piezoelectric thin film resonator of claim 1.

18. The high frequency filter of claim 17 has a ladder topology.

19. A voltage-controlled oscillator comprising the piezoelectric thin film resonator of claim 1.

20. A piezoelectric thin film resonator comprising:
   a substrate in which a cavity is formed;
   a first electrode having a first electrode edge and partly spanning the cavity in the substrate;
   a piezoelectric layer placed on the first electrode;
   a second electrode having a second electrode edge and placed on the piezoelectric layer;
   a resonator unit constituted by overlapping parts of the first electrode, the piezoelectric layer and the second electrode; and
   a second lead wiring which is integral with the second electrode, extends to the substrate where the cavity is not present, and has a width which is larger than 50% of a peripheral length of the cavity to which the second electrode edge extends,
   wherein a first length defined by the first electrode edge of the resonator unit is by 50% or more larger than an entire peripheral length of the resonator unit.

* * * * *